US006348717B1

(12) United States Patent
Miki

(10) Patent No.: US 6,348,717 B1
(45) Date of Patent: Feb. 19, 2002

(54) SEMICONDUCTOR INTEGRATED CIRCUIT HAVING AN IMPROVED VOLTAGE SWITCHING CIRCUIT

(75) Inventor: Atsunori Miki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/385,021

(22) Filed: Aug. 30, 1999

(30) Foreign Application Priority Data

Aug. 31, 1998  (JP) ........................................... 10-245605

(51) Int. Cl.⁷ ............................................... H01L 29/76
(52) U.S. Cl. ......................... 257/368; 257/372; 257/373
(58) Field of Search .................................. 257/372, 373

(56) References Cited

U.S. PATENT DOCUMENTS 5,382,819 A  * 1/1995  Honjo .......................... 257/371
5,473,183 A  * 12/1995 Yonemoto .................... 257/371

FOREIGN PATENT DOCUMENTS

JP   55-146965   11/1980
JP   6-151734    5/1994

OTHER PUBLICATIONS

Japanese Office Action dated Sep. 12, 2000 with partial English translation.

* cited by examiner

*Primary Examiner*—Fetsum Abraham
(74) *Attorney, Agent, or Firm*—McGinn & Gibb, PLLC

(57) ABSTRACT

The present invention provides a circuitry comprising: a first switching transistor connected in series between an output node and a first voltage supply line which supplies a fist voltage level, the first switching transistor having a first control gate receiving a first control signal; and a second switching transistor connected in series between the output node and a second voltage supply line which supplies a second voltage level which is lower than the first voltage level, the second switching transistor having a second control gate receiving a second control signal, so that the first and second switching transistors are connected in series between the first and second voltage supply lines, wherein the first switching transistor has a first sub-gate which is connected to the output node, and the second switching transistor has a second sub-gate which is connected to the second voltage supply line.

2 Claims, 2 Drawing Sheets

SEMICONDUCTOR INTEGRATED CIRCUIT HAVING AN IMPROVED VOLTAGE SWITCHING CIRCUIT

BACKGROUND OF THE INVENTION

The present invention relates to a semiconductor integrated circuit, and more particularly to a semiconductor integrated circuit having a switching circuit for switching voltage to be supplied to a decoder which is used for selecting memory cell gate.

In the conventional semiconductor integrated circuit, a switching circuit is provided for switching a voltage to be supplied to a decoder for selecting gate of he memory cell, so as to supply an appropriate voltage to the decoder of the gate.

One of the conventional switching circuits is disclosed in Japanese patent publication No. 6-103426, Japanese patent No. 2516296 and Japanese laid-open patent publication No. 10-505953. Japanese patent publication No. 6-103426 discloses that a direct current between a power source and a ground is prevented to reduce a power consumption of a driver circuit of a liquid crystal display device. Japanese patent No. 2516296 discloses that in a word line driver circuit of a dynamic random access memory, a gate of an access transistor is kept in negative potential for driving word lines. Japanese laid-open patent publication No. 10-505953 discloses that in a control circuit of a thyristor, an igniter gate is provided to switch the thyristor into conductive state for application of a positive voltage to the gate of the thyristor.

FIG. 1 is a circuit diagram illustrative of one of the conventional switching circuits. The circuit comprises a series connection of two switching transistors M1 and M2 such as MOS field effect transistors between first and second voltage supply lines L1 and L2. The first switching transistor M1 has a gate which receives a first gate control signal S1. The second switching transistor M2 has a gate which receives a second gate control signal S2. A source of the first switching transistor M1 is connected to an output node OUT. A source of the second switching transistor M2 is connected to the second voltage supply line L2. The first voltage supply line L1 supplies a higher voltage than the second voltage supply line L2. For example, the first voltage supply line L1 supplies a positive voltage level Vdd and the second voltage supply line L2 supplies a ground voltage level Vss. Alternatively, the first voltage supply line L1 may supply a ground voltage level Vss and the second voltage supply line L2 may supply a negative voltage level Vneg. The first switching transistor M1 has a sub-gate which is connected to the second voltage supply line L2. The second switching transistor M2 also has a sub-gate which is connected to the second voltage supply line L2. Thus, both the sub-gates of the first and second switching transistors M1 and M2 are commonly connected to the second voltage supply line L2. The above first and second switching control signals S1 and S2 are supplied to control the voltage level appearing at the output node OUT. Each of the first and second switching control signals S1 and S2 may be the power voltage level Vcc, the ground voltage level Vss and the negative voltage level Vneg.

The following descriptions will be in the case when the positive voltage Vdd appears at the output node OUT. The first gate control signal S1 is the power voltage Vcc, whilst the second gate control signal S2 is either the ground voltage Vss or the negative voltage Vneg. The first voltage supply line L1 supplies the positive voltage Vdd so that a drain of the first switching transistor M1 receives the positive voltage Vdd. The second voltage supply line L2 supplies either the ground voltage Vss or the negative voltage Vneg so that a source of the second switching transistor M2 receives either the ground voltage Vss or the negative voltage Vneg. A maximum output voltage level appearing at the output node OUT is a voltage corresponding to subtraction of a threshold voltage of the first switching transistor M1 from the power voltage Vcc, for example, (Vcc−Vtm1). If Vdd is lower than Vcc−Vtm1, then Vdd appears on the output node OUT.

The first threshold voltage Vtm1 of the first switching transistor M1 receives an influence of a back gate bias characteristic due to a second threshold voltage Vtm2 of the second switching transistor M2 since a source voltage of the first switching transistor M1 is higher in potential than the sub-gate voltage level of the first switching transistor M1 by the second threshold voltage Vtm2 of the second switching transistor M2. For this reason, if the power voltage level Vcc is low, then the positive voltage Vdd does not appear on the output node OUT.

In the above circumstances, it had been required to develop a novel switching circuit free from the above problem.

SUMMARY OF THE INVENTION

Accordingly, it is an object of the present invention to provide a novel switching circuit free from the above problems.

It is a further object of the present invention to provide a novel switching circuit capable of outputting a predetermined voltage level onto an output node even if a power voltage level is low.

It is a still further object of the present invention to provide a novel switching circuit capable of preventing the switching circuit from performing bipolar action or thyristor action.

The present invention provides a circuitry comprising: a first switching transistor connected in series between an output node and a first voltage supply line which supplies a first voltage level, the first switching transistor having a first control gate receiving a first control signal; and a second switching transistor connected in series between the output node and a second voltage supply line which supplies a second voltage level which is lower than the first voltage level, the second switching transistor having a second control gate receiving a second control signal, so that the first and second switching transistors are connected in series between the first and second voltage supply lines, wherein the first switching transistor has a first sub-gate which is connected to the output node, and the second switching transistor has a second sub-gate which is connected to the second voltage supply line.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
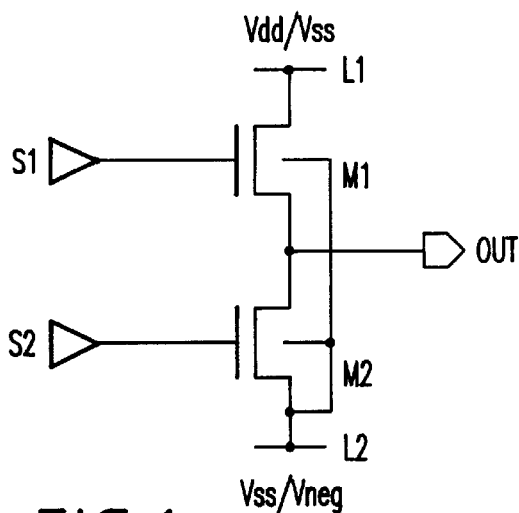
FIG. 1 is a circuit diagram illustrative of one of the conventional switching circuits.

The present invention provides a circuitry comprising: a first switching transistor connected in series between an output node and a first voltage supply line which supplies a first voltage level, the first switching transistor having a first control gate receiving a first control signal; and a second switching transistor connected in series between the output node and a second voltage supply line which supplies a second voltage level which is lower than the first voltage level, the second switching transistor having a second control gate receiving a second control signal, so that the first and second switching transistors are connected in series between the first and second voltage supply lines, wherein the first switching transistor has a first sub-gate which is connected to the output node, and the second switching transistor has a second sub-gate which is connected to the second voltage supply line.

It is preferable that a source of the first switching transistor is connected to the output node and the first sub-gate, and a drain of the first switching transistor is connected to the first voltage supply line, whilst a source of the second switching transistor is connected to the second voltage supply line, and a drain of the second switching transistor is connected to the output node and the source of the first switching transistor.

It is also preferable that the first and second switching transistors are formed over first and second triple well structures, and each of the first and second triple well structures comprises a first well of a first conductivity type formed in a semiconductor substrate, a second well of a second conductivity type formed within the first well so that the second well is separated by the first well from the semiconductor substrate, and diffusion regions of the first conductivity type formed in the second well so that the diffusion regions are separated by the second well from each other and also separated from the first well by the second well, and wherein the diffusion regions serve as source and drain regions of each of the first and second switching transistors, and the second well is connected to each of the first and second sub-gate of each of the first and second switching transistors, and each of the first and second control gates is provided over a channel region defined between the diffusion regions.

In accordance with the above described novel circuit configuration of the switching circuit, the first sub-gate and the source of the first switching transistor are commonly connected to the output node, so that the first sub-gate and the source of the first switching transistor have the same potential, whereby the first threshold voltage of the first switching transistor is free from an influence of a back gate bias characteristic. For this reason, if the power voltage is applied to the first gate of the first switching transistor, then the output voltage appears on the output node, which corresponds to the subtraction of the threshold voltage of the first switching transistor from the power voltage. Since, however, the first sub-gate and the source of the first switching transistor have the same potential, the first sub-gate and the source of the first switching transistor have the same potential is so small that the output voltage is close to the power voltage. Thus, even if the power voltage is so low, then the output voltage is never negative level.

It is preferable to further comprise: an additional transistor being connected in series between the first voltage supply line and the output node, and the additional transistor having an additional control gate receiving the first control signal and the additional transistor having an additional sub-gate which is connected to the second sub-gate of the second switching transistor. The additional switching transistor is additionally provided which has an additional sub-gate which is connected to the second sub-gate of the second switching transistor in order to prevent the above circuit from performing bipolar action or thyristor action.

PREFERRED EMBODIMENT

Figure 2:
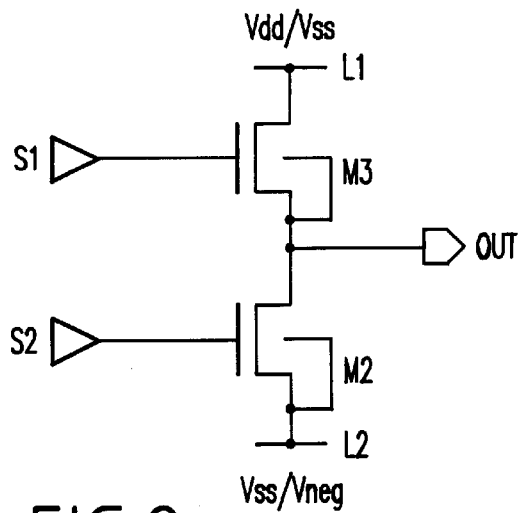
FIG. 2 is a circuit diagram illustrative of a novel switching circuit in a first embodiment in accordance with the present invention.

A first embodiment according to the present invention will be described in detail with reference to the drawings. FIG. 2 is a circuit diagram illustrative of a novel switching circuit in a first embodiment in accordance with the present invention.

The switching circuit comprises a series connection of first and second switching transistors M3 and M2 such as MOS field effect transistors between first and second voltage supply lines L1 and L2. The first switching transistor M3 has a gate which receives a first gate control signal S1. The second switching transistor M2 has a gate which receives a second gate control signal S2. A source of the first switching transistor M3 is connected to an output node OUT. A source of the second switching transistor M2 is connected to the second voltage supply line L2. The first voltage supply line L1 supplies a higher voltage than the second voltage supply line L2. For example, the first voltage supply line L1 supplies a positive voltage level Vdd and the second voltage supply line L2 supplies a ground voltage level Vss. Alternatively, the ftst voltage supply line L1 may supply a power voltage level Vcc and the second voltage supply line L2 may supply a negative voltage level Vneg. The first switching transistor M3 has a first sub-gate which is connected to the source of the first switching transistor M3, so that the first sub-gate has the same potential as the output node OUT connected to the source of the first switching transistor M3. The second switching transistor M2 also has a second sub-gate which is connected to the second voltage supply line L2. Thus, both the first and second sub-gates of the first and second switching transistors M3 and M2 are isolated from each other to have different voltage levels. The first sub-gate of the first switching transistor M3 has a potential which is higher in potential by a second threshold voltage Vtm2 of the second switching transistor M2 than the second sub-gate of the second switching transistor M2.

The above first and second switching control signals S1 and S2 are supplied to control the voltage level appearing at the output node OUT. Each of the first and second switching control signals S1 and S2 may be the power voltage level Vcc, the ground voltage level Vss and the negative voltage level Vneg.

The above improved circuit configuration is that both the first and second sub-gates are isolated from each other so that the first sub-gate has the same potential as the output node OUT which is higher than the second sub-gate, whereby the first threshold voltage VtM3 of the first switching transistor M3 is free from any substantial influence of a back gate bias characteristic, since a source voltage of the first switching transistor M3 is equal in potential to the sub-gate voltage level of the first switching transistor M3. For this reason, if the power voltage level Vcc is too low, then the positive voltage Vdd appears on the output node OUT.

Figure 3:
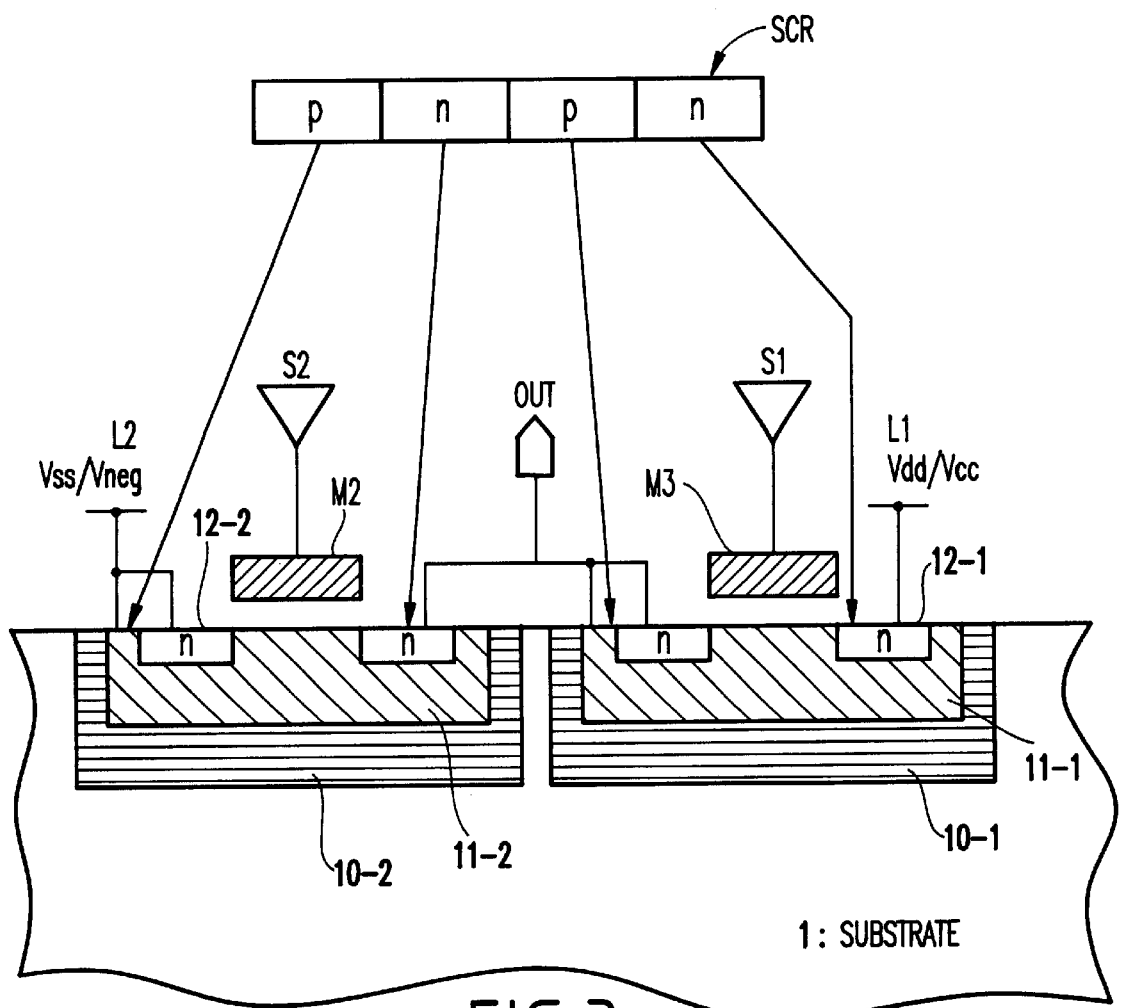
FIG. 3 is a fragmentary cross sectional elevation view illustrative of a novel switching circuit of FIG. 2 as integrated over a triple well structure in a semiconductor substrate in a first embodiment in accordance with the present invention.

FIG. 3 is a fragmentary cross sectional elevation view illustrative of a novel switching circuit of FIG. 2 as integrated over a triple well structure in a semiconductor substrate in a first embodiment in accordance with the present invention.

The above novel switching circuit configuration may be realized in the following triple well structure in the semiconductor substrate. First and second n-wells 10-1 and 10-2 are formed in upper regions of a p-type semiconductor substrate 1. The first and second n-wells 10-1 and 10-2 are separated from each other. First and second p-wells 11-1 and 11-2 are formed in the first and second n-wells 10-1 and 10-2 respectively, so that the first and second p-wells 11-1 and 11-2 are separated by the first and second n-wells 10-1 and 10-2 from the p-type semiconductor substrate 1. Further, first and second n-type diffusion layers 12-1 and 12-2 are formed in the first and second p-wells 11-1 and 11-2 respectively, so that the first and second n-type diffusion layers 12-1 and 12-2 are separated by the first and second p-wells 11-1 and 11-2 from the first and second n-wells 10-1 and 10-2 respectively.

The two first n-type diffusion layers 12-1 correspond to source and drain regions of the first switching transistor M3. The drain region 12-1 of the first switching transistor M3 is connected to the first voltage supply line L1 which supplies either the positive voltage Vdd or the power voltage Vcc. The source region 12-1 of the first switching transistor is connected to the output node OUT. A first channel region is defined between the source and drain regions 12-1 of the first switching transistor M3. A first gate is provided on a gate insulation film over the first channel region between the source and drain regions 12-1 of the first switching transistor M3. The first gate control signal S1 is applied to the first gate of the first switching transistor M3. The first p-well 11-1 corresponds to the first sub-gate of the first switching transistor 11-1. The first p-well 11-1 is connected to the output node OUT. This means that the first sub-gate of the first switching transistor M3 is connected to the output node OUT. Thus, the source of the first switching transistor M3 and the first sub-gate of the switching transistor M3 are connected to the output node OUT, whereby the source and the sub-gate of the first switching transistor M3 have the same potential.

The two second n-type diffusion layers 12-2 correspond to source and drain regions of the second switching transistor M2. The source region 12-2 of the second switching transistor M2 is connected to the second voltage supply line L2 which supplies either the ground voltage Vss or the negative voltage Vneg. The drain region 12-2 of the second switching transistor is connected to the output node OUT. A second channel region is defined between the source and drain regions 12-2 of the second switching transistor M2. A second gate is provided on a gate insulation film over the second channel region between the source and drain regions 12-2 of the second switching transistor M2. The second gate control signal S2 is applied to the second gate of the second switching transistor M2. The second p-well 11-2 corresponds to the second sub-gate of the second switching transistor 11-2. The second p-well 11-2 is connected to the second voltage supply line L2. This means that the second sub-gate of the second switching transistor M2 is connected to the second voltage supply line L2. Thus, the source of the second switching transistor M2 and the second sub-gate of the switching transistor M2 are connected to the second voltage supply line L2, whereby the source and the sub-gate of the second switching transistor M2 have the same potential. Namely, the first and second sub-gates of the first and second switching transistors M3 and M2 are isolated to have different potentials from each other, so that the first sub-gate of the first switching transistor M3 is higher in potential level by a second threshold voltage of the second switching transistor M2 than the second sub-gate of the second switching transistor M2.

In addition, the first and second n-wells 101 and 10-2 are fixed higher in potential level than the fist and second p-wells 11-1 and 11-2 respectively, so as to prevent forward currents from the first and second p-wells 11-1 and 11-2 to the first and second n-wells 10-1 and 10-2 respectively. If, for example, the potential of the p-well 11 is changed in the range of the positive voltage Vdd to the negative voltage Vneg, then the potential of the n-well 10 is fixed over the positive voltage Vdd.

Operations of the above novel switching circuit of FIGS. 2 and 3 will be described with reference to the following table 1.

TABLE 1

| Vdrain of M3 | Vsource of M2 | S1 | S2 | OUT |
|---|---|---|---|---|
| Vdd | Vss | Vcc | Vss | Vdd |
| Vdd | Vneg | Vcc | Vneg | Vdd |
| Vdd | Vss | Vss | Vcc | Vss |
| Vss | Vneg | Vcc | Vneg | Vss |
| Vdd | Vneg | Vneg | Vcc/Vss | Vneg |
| Vss | Vneg | Vneg | Vcc/Vss | Vneg |

Vdrain of M3 is the voltage of the drain of the first switching transistor M3, the Vsource of M2 is the voltage of the source of the second switching transistor M2, S1 is the voltage of the first gate control signal applied to the first gate of the first switching transistor M3, S2 is the voltage of the second gate control signal applied to the second gate of the second switching transistor M2, and OUT is the output voltage of the output node OUT.

In view of the output voltage levels, the operations of the above novel switching circuit may be divided into the following three cases. The first case is that the positive voltage Vdd appears on the output node OUT. The second case is that the ground voltage Vss appears on the output node OUT. The third case is that the negative voltage Vneg appears on the output node OUT.

In the first case where the positive voltage Vdd appears on the output node OUT, operations of the above novel switching circuit will be described. As shown on Table 1, the first gate control signal S1 is the power voltage level Vcc, whilst the second gate control signal S2 is either the ground voltage Vss or the negative voltage Vneg. The drain of the first switching transistor M3 has the positive voltage Vdd. The source of the second switching transistor M2 has either the ground voltage Vss or the negative voltage Vneg. A maximum voltage level appearing on the output node OUT is a voltage (Vcc−Vtm3) which corresponds to a subtraction of the threshold voltage Vtm3 of the first switching transistor M3 from the power voltage Vcc. If Vdd is lower than Vcc−Vtm3, then Vdd appears on the output node OUT. Since the source of the first switching transistor M3 is equal in potential to the first sub-gate of the first switching transistor M3, the threshold voltage of the first switching transistor M3 is low. This means that even if the power voltage level Vcc is low, then the positive voltage Vdd appears on the output node OUT.

In the second case where the ground voltage Vss appears on the output node OUT, operations of the above novel switching circuit will be described. As shown on Table 1, the first gate control signal S1 is the ground voltage Vss, whilst the second gate control signal S2 is the power voltage level Vcc. The drain of the first switching transistor M3 has the positive voltage Vdd. The source of the second switching transistor M2 has the ground voltage Vss. The ground voltage Vss appears on the output node OUT.

Alternatively, the first gate control signal S1 is the power voltage Vcc, whilst the second gate control signal S2 is the negative voltage level Vneg. The drain of the first switching transistor M3 has the ground voltage Vss. The source of the second switching transistor M2 has the negative voltage Vneg. The ground voltage Vss appears on the output node OUT.

In the third case where the negative voltage Vneg appears on the output node OUT, operations of the above novel switching circuit will be described. As shown on Table 1, the first gate control signal S1 is the negative voltage Vneg, whilst the second gate control signal S2 is the power voltage level Vcc. The drain of the first switching transistor M3 has the positive voltage Vdd. The source of the second switching transistor M2 has the negative voltage Vneg. The negative voltage Vneg appears on the output node OUT.

Alternatively, the first gate control signal S1 is the negative voltage Vneg, whilst the second gate control signal S2 is the ground voltage level Vss. The drain of the first switching transistor MS has the positive voltage Vdd. The source of the second switching transistor M2 has the negative voltage Vneg. The negative voltage Vneg appears on the output node OUT.

Further alternatively, the first gate control signal S1 is the negative voltage Vneg, whilst the second gate control signal S2 is the power voltage level Vcc. The drain of the first switching transistor M3 has the ground voltage Vss. The source of the second switching transistor M2 has the negative voltage Vneg. The negative voltage Vneg appears on the output node OUT.

Furthermore alternatively, the first gate control signal S1 is the negative voltage Vneg, whilst the second gate control signal S2 is the ground voltage level Vss. The drain of the first switching transistor M3 has the ground voltage Vss. The source of the second switching transistor M2 has the negative voltage Vneg. The negative voltage Vneg appears on the output node OUT.

Figure 4:
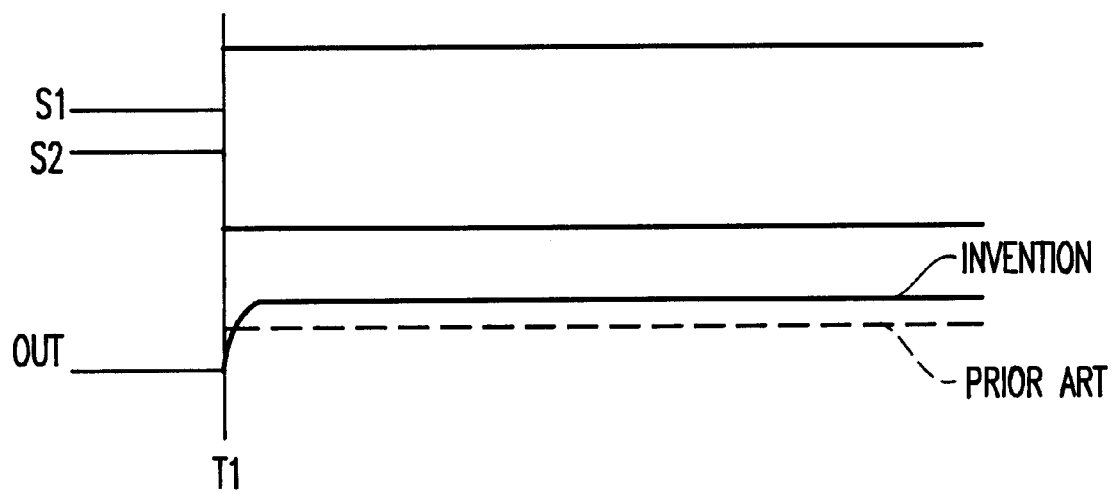
FIG. 4 is a diagram illustrative of waveforms of the above novel switching circuit of FIG. 2 and the above conventional switching circuit of FIG. 1 when the output voltage level appearing on the output node OUT is changed from the ground voltage Vss to the positive voltage Vdd or from the negative voltage Vneg to the ground voltage Vss.

FIG. 4 is a diagram illustrative of waveforms of the above novel switching circuit of FIG. 2 and the above conventional switching circuit of FIG. 1 when the output voltage level appearing on the output node OUT is changed from the ground voltage Vss to the positive voltage Vdd or from the negative voltage Vneg to the ground voltage Vss, where a real line represents the waveform of the output voltage of the novel switching circuit whilst a broken line represents the waveform of the output voltage of the conventional switching circuit.

When the time is T1, the first switching transistor M3 turns ON, whilst the second switching transistor M2 turns OFF, whereby the positive voltage Vdd appears on the output node OUT, wherein the power voltage level Vcc is higher than the sum of the positive voltage Vdd and the threshold voltage Vtm3 of the first switching transistor M3.

Alternatively, the first switching transistor M3 turns ON, whilst the second switching transistor M2 turns OFF, whereby the ground voltage Vss appears on the output node OUT, wherein the power voltage level Vcc is higher than the sum of the ground voltage Vss and the threshold voltage Vtm3 of the first switching transistor M3.

If the drain of the first switching transistor M3 has the ground voltage Vss, whilst the source of the second switching transistor M2 has either the negative voltage Vneg or the low voltage is applied to the gate, the ground voltage Vss appears on the output node OUT provided that the power voltage level Vcc is higher than the sum of the ground voltage Vss and the threshold voltage level Vtm3 of the first switching transistor M3. No negative voltage appears on the output node OUT.

Consequently, in accordance with the above described novel circuit configuration of the switching circuit, the sub-gate and the source of the first switching transistor M3 are commonly connected to the output node OUT so that the sub-gate and the source of the first switching transistor M3 have the same potential, whereby the first threshold voltage Vtm3 of the first switching transistor M3 is free from an influence of a back gate bias characteristic. For this reason, if the power voltage Vcc is applied to the first gate of the first switching transistor M3, then the output voltage appears on the output node OUT, which corresponds to the subtraction (Vcc−Vtm3) of the threshold voltage Vtm3 of the first switching transistor M3 from the power voltage Vcc. Since, however, the sub-gate and the source of the first switching transistor M3 have the same potential, the sub-gate and the source of the first switching transistor M3 have the same potential is so small that the output voltage is close to the power voltage Vcc. Thus, even if the power voltage Vcc is so low, then the output voltage is never negative level.

Figure 5:
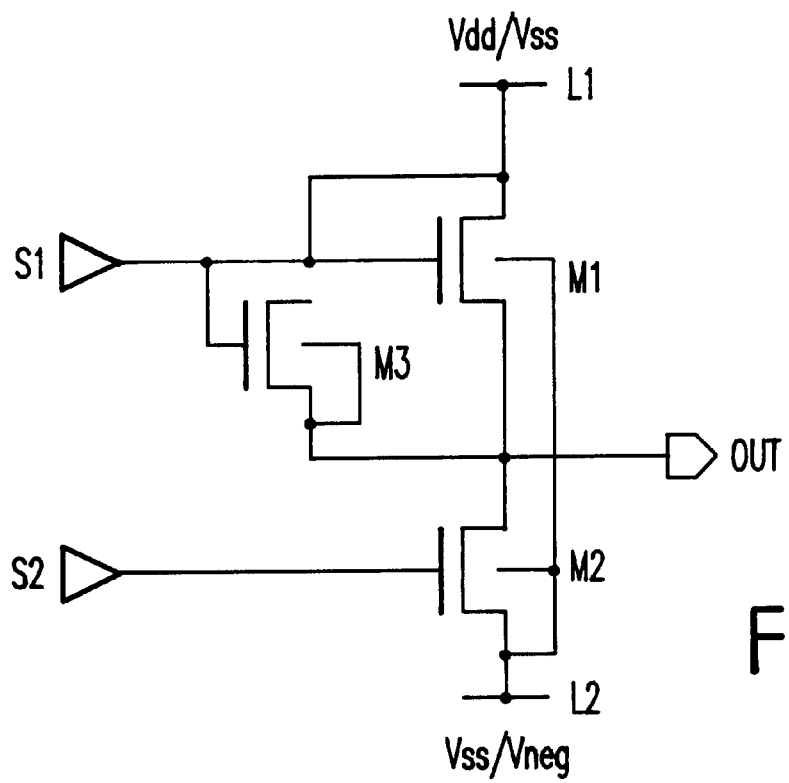
FIG. 5 is a circuit diagram illustrative of a novel switching circuit in a second embodiment in accordance with the present invention.

A second embodiment according to the present invention will be described in detail with reference to the drawings. FIG. 5 is a circuit diagram illustrative of a novel switching circuit in a second embodiment in accordance with the present invention.

The switching circuit comprises a series connection of first and second switching transistors M3 and M2 such as MOS field effect transistors between first and second voltage supply lines L1 and l2, and an additional transistor M1 which is connected between the first voltage supply line L1 and the output node OUT. Namely, the additional transistor M1 is connected in parallel to the first switching transistor M3 and between the first voltage supply line L1 and the second switching transistor M2.

The first switching transistor M3 has a gate which receives a first gate control signal S1. The second switching transistor M2 has a gate which receives a second gate control signal S2. A source of the first switching transistor M3 is connected to an output node OUT. A source of the additional transistor M1 is connected to the output node OUT. A source of the second switching transistor M2 is connected to the second voltage supply line L2. The fist voltage supply line L1 supplies a higher voltage than the second voltage supply line L2. For example, the first voltage supply line L1 supplies a positive voltage level Vdd and the second voltage supply line L2 supplies a ground voltage level Vss. Alternatively, the first voltage supply line L1 may supply a power voltage level Vcc and the second voltage supply line L2 may supply a negative voltage level Vneg. The first switching transistor M3 has a first sub-gate which is connected to the source of the first switching transistor M3, so that the first sub-gate has the same potential as the output node OUT connected to the source of the first switching transistor M3. The second switching transistor M2 also has a second sub-gate which is connected to the second voltage supply line L2. The additional transistor M1 also has an additional sub-gate which is connected to the second voltage supply line L2, so that the additional sub-gate of the additional transistor M1 is connected to the second sub-gate of the second switching transistor M2, whereby the additional sub-gate of the additional transistor M1 has the same potential as the second sub-gate of the second switching transistor M2. Thus, both the first and second sub-gates of the first and second switching transistors M3 and M2 are isolated from each other to have different voltage levels. The first sub-gate of the first switching transistor M3 has a potential which is higher in potential by a second threshold voltage Vtm2 of the second switching transistor M2 than the second sub-gate of the second switching transistor M2.

The above first and second switching control signals S1 and S2 are supplied to control the voltage level appearing at the output node OUT. Each of the first and second switching control signals S1 and S2 may be the power voltage level Vcc, the ground voltage level Vss and the negative voltage level Vneg.

The above improved circuit configuration is that both the first and second sub-gates are isolated from each other so that the first sub-gate has the same potential as the output node OUT which is higher than the second sub-gate, whereby the first threshold voltage Vtm3 of the first switching transistor M3 is free from any substantial influence of a back gate bias characteristic, since a source voltage of the first switching transistor M3 is equal in potential to the sub-gate voltage level of the first switching transistor M3. For this reason, if the power voltage level Vcc is too low, then the positive voltage Vdd appears on the output node OUT.

The operational timing of the above second novel circuit configuration of FIG. 5 is the same as shown in FIG. 4. At the time T1, the first switching transistor M3 and the additional switching transistor M1 turn ON concurrently, whilst the second switching transistor M2 turns OFF.

In this second embodiment, an additional n-channel switching transistor is additionally provided which has a sub-gate which is connected to the sub-gate of the second switching transistor M2 in order to prevent the above circuit from performing bipolar action or thyristor action.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuitry comprising:
a first switching transistor connected in series between an output node and a first voltage supply line which supplies a first voltage level, said first switching transistor having a first control gate receiving a first control signal; and,
a second switching transistor connected in series between said output node and a second voltage supply line which supplies a second voltage level which is lower than said first voltage level, said second switching transistor having a second control gate receiving a second control signal, so that said first and second switching transistors are connected in series between said first and second voltage supply lines,
wherein said first switching transistor has a first sub-gate which is connected to said output node, and said second switching transistor has a second sub-gate which is connected to said second voltage supply line, and
wherein a source of said first switching transistor is connected to said output node and said first sub-gate, and a drain of said first switching transistor is connected to said first voltage supply line, whilst a source of said second switching transistor is connected to said second voltage supply line, and a drain of said second switching transistor is connected to said output node and said source of said first switching transistor, and,
wherein said first and second switching transistors are formed over first and second triple well structures, and each of said first and second triple well structures comprises a first well of a first conductivity type formed in a semiconductor substrate, a second well of a second conductivity type formed within said first well so that said second well is separated by said first well from said semiconductor substrate, and diffusion regions of said first conductivity type formed in said second well so that said diffusion regions are separated by said second well from each other and also separated from said first well by said second well, and wherein said diffusion regions serve as source and drain regions of each of said first and second switching transistors, and said second well is connected to each of said first and second sub-gate of each of said first and second switching transistors, and each of said first and second control gates is provided over a channel region defined between said diffusion regions.

2. A circuitry comprising:
a first switching transistor connected in series between an output node and a first voltage supply line which supplies a first voltage level, said first switching transistor having a first control gate receiving a first control signal; and,
a second switching transistor connected in series between said output node and a second voltage supply line which supplies a second voltage level which is lower than said first voltage level, said second switching transistor having a second control gate receiving a second control signal, so that said first and second switching transistors are connected in series between said first and second voltage supply lines, wherein said first switching transistor has a first sub-gate which is connected to said output node, and said second switching transistor has a second sub-gate which is connected to said second voltage supply line, and,
further comprising an additional transistor being connected in series between said first voltage supply line and said output node, and said additional transistor having an additional control gate receiving said first control signal and said additional transistor having an additional sub-gate which is connected to said second sub-gate of said second switching transistor.

* * * * *